US012315798B2

(12) United States Patent
Lee et al.

(10) Patent No.: US 12,315,798 B2
(45) Date of Patent: *May 27, 2025

(54) INTEGRATED CIRCUIT WITH GUARD RING

(71) Applicant: TAIWAN SEMICONDUCTOR MANUFACTURING COMPANY, LTD., Hsinchu (TW)

(72) Inventors: Chiao-Han Lee, Hsinchu (TW); Chi-Hsien Lin, Hsinchu (TW); Ho-Hsiang Chen, Hsinchu (TW); Hsien-Yuan Liao, Hsinchu (TW); Tzu-Jin Yeh, Hsinchu (TW); Ying-Ta Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/508,766

(22) Filed: Nov. 14, 2023

(65) Prior Publication Data
US 2024/0088027 A1 Mar. 14, 2024

Related U.S. Application Data

(63) Continuation of application No. 17/389,795, filed on Jul. 30, 2021, now Pat. No. 11,817,385, which is a (Continued)

(51) Int. Cl.
*H01L 23/522* (2006.01)
*H01L 23/00* (2006.01)
(Continued)

(52) U.S. Cl.
CPC ........ *H01L 23/5227* (2013.01); *H01L 23/528* (2013.01); *H01L 23/5286* (2013.01); (Continued)

(58) Field of Classification Search
CPC ............... H01L 23/5227; H01L 23/585; H01L 23/5286; H01L 23/645; H01L 23/562; (Continued)

(56) References Cited

U.S. PATENT DOCUMENTS 5,416,356 A * 5/1995 Staudinger .............. H01L 27/08
257/531
6,060,882 A * 5/2000 Doty ................ G01R 33/34046
324/318

(Continued)

*Primary Examiner* — Michael M Trinh
(74) *Attorney, Agent, or Firm* — Hauptman Ham, LLP

(57) ABSTRACT

An integrated circuit includes an inductor that includes a first set of conductors in at least a first metal layer, and a guard ring enclosing the inductor. The guard ring includes a first conductor extending in a first direction, a second conductor extending in a second direction, and a first set of staggered conductors coupled to a first end of the first conductor and a first end of the second conductor. The first set of staggered conductors includes a second set of conductors in a second metal layer, a third set of conductors in a third metal layer and a first set of vias coupling the second set of conductors with the third set of conductors. The third metal layer is above the second metal layer. All metal lines in the second metal layer that are part of the guard ring extend in the first direction.

20 Claims, 5 Drawing Sheets

Related U.S. Application Data continuation of application No. 16/207,041, filed on Nov. 30, 2018, now Pat. No. 11,081,444, which is a continuation of application No. 14/303,206, filed on Jun. 12, 2014, now Pat. No. 10,163,779.

(51) Int. Cl.
*H01L 23/528* (2006.01)
*H01L 23/58* (2006.01)
*H01L 23/64* (2006.01)
*H10D 1/20* (2025.01)
*H10D 30/67* (2025.01)

(52) U.S. Cl.
CPC .......... *H01L 23/562* (2013.01); *H01L 23/585* (2013.01); *H01L 23/645* (2013.01); *H10D 1/20* (2025.01); *H10D 30/674* (2025.01); *H01L 2924/0002* (2013.01)

(58) Field of Classification Search
CPC ............... H01L 23/528; H01L 28/10; H01L 2924/19042; H10D 1/20; H10D 30/674; H10D 30/6728; H10D 30/6733; H10D 30/6734; H10D 30/6757
See application file for complete search history.

(56) References Cited

U.S. PATENT DOCUMENTS

| | | | |
|---|---|---|---|
| 6,921,959 B2* | 7/2005 | Watanabe | H01L 28/10 |
| | | | 257/E21.022 |
| 7,999,386 B2 | 8/2011 | Uchida et al. | |
| 8,421,188 B2* | 4/2013 | Uchida | H01L 23/585 |
| | | | 257/E29.134 |
| 8,791,501 B1* | 7/2014 | Fuentes | H01L 23/481 |
| | | | 257/659 |
| 8,836,133 B2* | 9/2014 | Huang | H01L 21/76834 |
| | | | 257/E21.585 |
| 9,406,605 B2 | 8/2016 | Liao et al. | |
| 10,163,779 B2* | 12/2018 | Lee | H01L 23/585 |
| 11,081,444 B2* | 8/2021 | Lee | H01L 28/10 |
| 11,817,385 B2* | 11/2023 | Lee | H01L 23/585 |
| 2014/0367835 A1* | 12/2014 | Wei | H01L 23/585 |
| | | | 438/618 |

* cited by examiner

INTEGRATED CIRCUIT WITH GUARD RING

PRIORITY CLAIM

The present application is a continuation of U.S. application Ser. No. 17/389,795, filed Jul. 30, 2021, now U.S. Pat. No. 11,817,385, issued Nov. 14, 2023, which is a continuation of U.S. application Ser. No. 16/207,041, filed Nov. 30, 2018, now U.S. Pat. No. 11,081,444, issued Aug. 3, 2021, which is a continuation of U.S. application Ser. No. 14/303,206, filed Jun. 12, 2014, now U.S. Pat. No. 10,163,779, issued Dec. 25, 2018, which are herein incorporated herein by reference in their entireties.

BACKGROUND

On-chip inductors are often used in integrated circuits such as radio frequency integrated circuits. Guard rings are used to isolate the coupling of on-chip inductors to other on-chip inductors, as well as other circuit components. In one direction metal routing, guard rings are rectangular-shaped.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
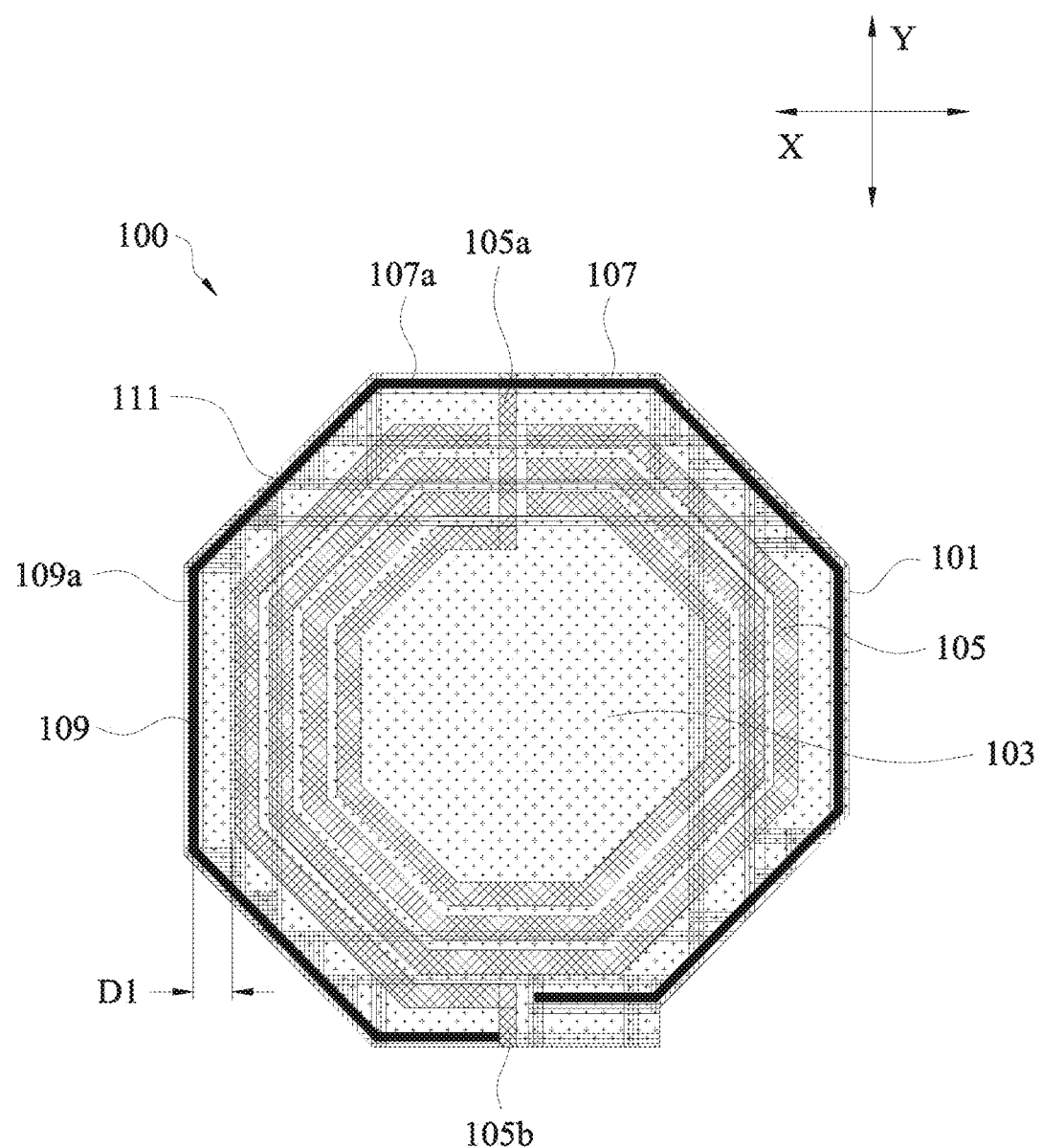
FIG. 1 is a diagram of an integrated circuit with a 1D metal routed guard ring, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

Rectangular-shaped guard rings waste space. For example, an integrated circuit that has a rectangular-shaped guard ring for isolating an octagonal-shaped inductor has unoccupied space between the guard ring and the inductor, which results in larger integrated circuit chips than are necessary to perform a given function. This wasted space is compounded and becomes further evident if more than one inductor/guard ring combination is arranged on a same chip. Some integrated circuits are designed based on one-direction or two-direction design rules. A 1D design rule describes an integrated circuit feature such as a metal line or layer that is allowed to be routed along a single directional path, for example, in an X or a Y direction. A 2D design rule describes an integrated circuit feature such as a metal line or layer that is allowed to be routed along a directional path that advances in both the X and the Y direction to form a slanted line, for example.

FIG. 1 is a diagram of an integrated circuit 100 with a 1D metal routed guard ring 101, in accordance with one or more embodiments.

Integrated circuit 100 comprises the guard ring 101 over a substrate 103, and an inductor 105 over the substrate 103. The guard ring 101 comprises first metal lines 107a of a first metal layer 107 and second metal lines 109a of a second metal layer 109. The first metal lines 107a are coupled with the second metal lines 109a. One or more of the first metal lines 107a and one or more of the second metal lines 109a are arranged to form at least one staggered line 111 that makes up a portion of the guard ring 101. Substrate 103 comprises one or more of silicon, glass, a polymer, an oxide, or other suitable material or combination of suitable materials.

An inductor, e.g., inductor 105, is a passive device which is used to store energy in a magnetic field. Inductors have a measurable inductance, which is a measure of the magnetic field generated from a conductor. Inductance varies according to the inductor characteristics such as a number of loops, loop sizes, wire diameter, and other suitable characteristics. In some embodiments, the inductor 105 is a spiral inductor that is a circular, polygonal, or other shaped inductor that is routed in a spiral formation. In some embodiments, the inductor 105 is octagonal-shaped. In some embodiments, the inductor 105 is circular-shaped. In some embodiments, the inductor 105 is triangular-shaped, hexagonal-shaped, trapezoidal-shaped, or other suitable shape. The inductor 105 comprises a conductive material such as a metal, a metal composite, or other suitable material that is formed in one or more metallization layers by one or more of a physical vapor deposition process, a chemical vapor deposition process, a plating process, or other suitable process.

The inductor 105 comprises inductor contacts 105a and 105b. The guard ring 101 surrounds the inductor 105 and makes it possible for the inductor contacts 105a and 105b to be coupled to one or more connections that are outside of the guard ring 101. For example, the guard ring 101 is configured to have one or more openings or partitions through which the inductor contacts 105a/b are coupled to a connection outside of the guard ring 101. The inductor contacts 105a/b are configured to extend above or below the guard ring 101 to facilitate coupling the inductor contacts 105a and 105b to the one or more connections that are outside of the guard ring 101.

In some embodiments, the first metal layer 107 is over the second metal layer 109. In other embodiments, the second metal layer 109 is over the first metal layer 107. The first metal layer 107 and the second metal layer 109 comprise a same or a different material or combination of materials. In some embodiments, the first metal layer 107 and/or the second metal layer 109 comprise a conductive material such as a metal, a metal composite, or other suitable material that is formed by one or more of a physical vapor deposition process, a chemical vapor deposition process, a plating process, or other suitable process.

The first metal lines 107a extend in a first direction X. The second metal lines 109a extend in a second direction Y. The first direction X is perpendicular to the second direction Y.

Two or more of the first metal lines 107a are offset from one another in one or more of the first direction X or the second direction Y. Two or more of the second metal lines 109a are offset from one another in one or more of the first direction X or the second direction Y. The offset first metal lines 107a and the offset second metal lines 109b are together configured to form the at least one staggered line 111. In some embodiments, at least one of the first metal lines 107a included in the at least one staggered line 111 has a first length. In some embodiments, two or more first metal lines 107a included in the at least one staggered line 111 are of the first length. In some embodiments, at least one of the first metal lines 107a included in the at least one staggered line 111 has a length different from the first length. In some embodiments, the first metal lines 107a included in the staggered line 111 have different lengths.

In some embodiments, the at least one of the second metal lines 109a included in the at least one staggered line 111 has a second length. In some embodiments, two of more second metal lines 109a included in the staggered line 111 are of the second length. In some embodiments, at least one of the second metal lines 109a included in the at least one staggered line 111 has a length different from the second length. In some embodiments, the second metal lines 109a included in the staggered line 111 have different lengths. In some embodiments, the first length is equal to the second length. In other embodiments, the first length is different from the second length.

In some embodiments, one or more of the first metal lines 107a and one or more of the second metal lines 109a included in the at least one staggered line 111 overlap.

The arrangement and configuration of the first metal lines 107a and the second metal lines 109a included in the at least one staggered line 111 form a guard ring 101 having the same shape as the inductor 105 while being in conformance with a 1D design rule. For example, a combination of first metal lines 107a and second metal lines 109a, are capable of being arranged to form a guard ring 101 that is octagonal, circular, trapezoidal, elliptical, triangular, parallelogram, hexagonal, pentagonal, or other shape such as another polygonal shape, a random shape having a staggered line that is primarily curved alone or in combination with a straight or a staggered line, or other suitable shape. In at least some embodiments, the arrangement and configuration of first metal lines 107a and the second metal lines 109a included in the at least one staggered line 111 form a guard ring 101 that is a different shape from the inductor 105 while being in conformance with a 1D design rule.

To form an octagonal guard ring 101, for example, the guard ring 101 includes four staggered lines 111, two first metal lines 107a that are continuous and have a length greater than the first metal lines 107a that are included in the four staggered lines 111, and two second metal lines 109a that are continuous and have a length greater than the second metal lines 109a included in the four staggered lines 111. In some embodiments, a continuous metal line optionally comprises a series of metal line segments that together form a continuous metal line that has a length greater than one of the metal lines included in the staggered lines 111, for example.

To form a guard ring 101 that is a right triangle, for example, the guard ring 101 optionally includes one staggered line 111, one first metal line 107a that has a length greater than the first metal lines 107a included in the staggered line 111, and one second metal line 109a that has a length greater than the second metal lines 109a included in the staggered line 111. To form a guard ring 101 that is a triangle other than a right triangle, the guard ring 101 includes two staggered lines 111, and one of one first metal line 107a that has a length greater than the first metal lines 107a included in the two staggered lines 111, or one second metal line 109a that has a length greater than the second metal lines 109a included in the two staggered lines 111.

In some embodiments, the arrangement and configuration of the first metal lines 107a and the second metal lines 109a included in the at least one staggered line 111 and/or otherwise included as a part of the guard ring 101 are arranged to be within a predetermined distance D1 from the inductor 105. In some embodiments, the predetermined distance D1 is uniform around the inductor 105.

The first metal lines 107a first ends and second ends. The second metal lines 109a comprise first ends and second ends. In some embodiments, the first metal lines 107a and the second metal lines 109a overlap at the first ends and the second ends of the first metal lines 107a and the second lines 109a. In some embodiments, other portions of the first metal lines 107a and the second metal lines 109a overlap. In some embodiments, the first metal lines 107a and the second metal lines 109a do not overlap.

Figure 2:
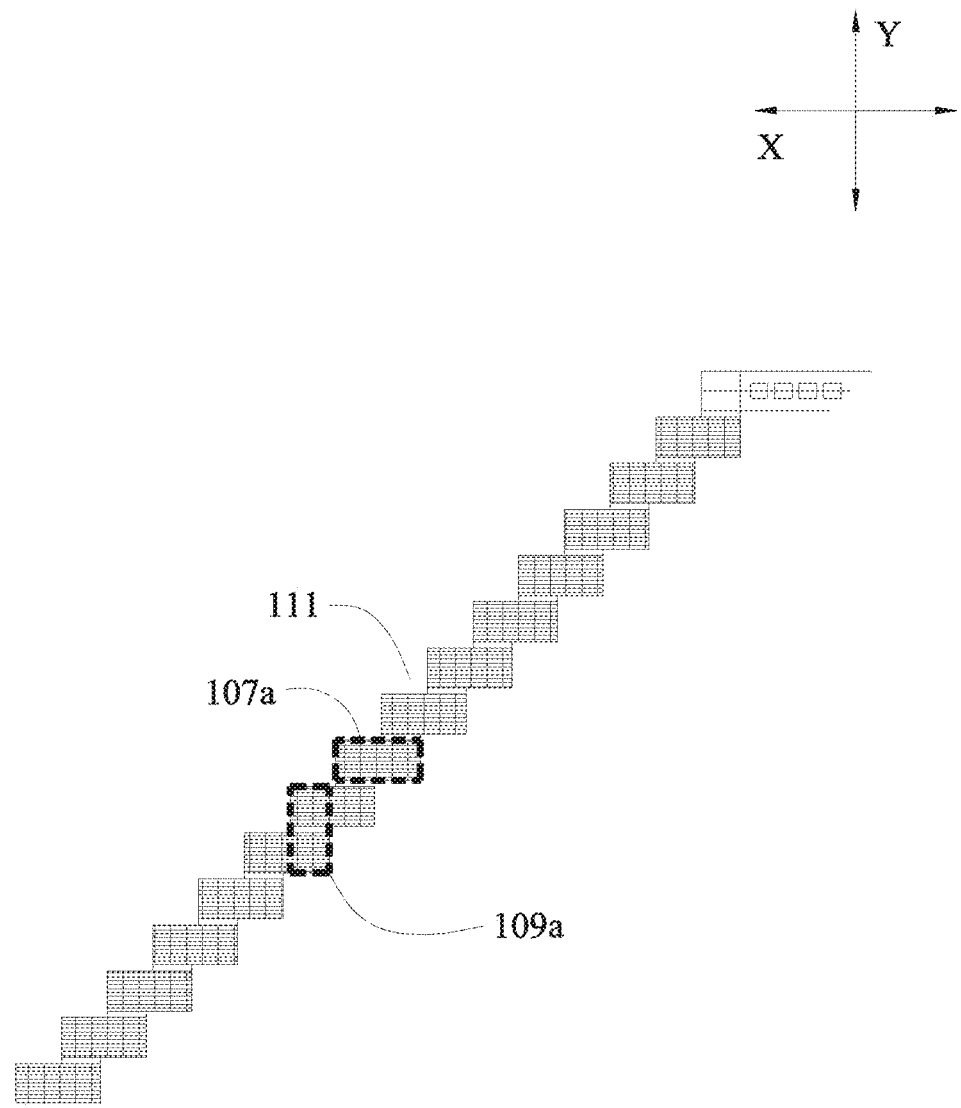
FIG. 2 is a diagram of a staggered line, in accordance with one or more embodiments.

FIG. 2 is a diagram of a staggered line 111, in accordance with one or more embodiments. Staggered line 111 comprises first metal lines 107a and second metal lines 109a. The first metal lines 107a extend in the first direction X and the second metal lines 109a extend in the second direction Y. The first metal lines 107a and the second metal lines 109a are coupled. A guard ring 101 that includes one or more staggered lines 111 has performance properties within an allowable process tolerance compared to a guard ring that is formed in compliance with a conventional 2D metal routing rule.

For example, the resistive and capacitive components of the inductor 105 may adversely affect a Q-factor and FSR of the inductor. The Q-factor is a measure of the inductor efficiency and is a ratio of the inductance to resistance at a given frequency. A higher Q-factor value indicates a lower rate of energy loss. The FSR of an inductor is the natural frequency in which the inductor oscillates freely. The integrated circuit 100, which is formed in compliance with a 1D design rule, achieves L and Q-factor values that are within a predefined allowable process tolerance compared to an integrated circuit that included a guard ring formed in compliance with a 2D design rule. A 1D design rule compliant integrated circuit having a square or rectangular guard ring that is formed to have the same or similar L and Q-factor values is larger than a 2D design rule compliant integrated circuit. But, unlike conventional 1D design rule compliant integrated circuits that have rectangular or square guard rings, the one or more staggered lines 111 form a guard ring 101 that is the same or similar shape as the inductor 105, such as a guard ring 101 that is octagonal, which reduces the space occupied by the integrated circuit 100 compared to a conventional 1D design rule compliant integrated circuit. For example, in some embodiments, the integrated circuit 100 occupies a space that is 8-12% less than a space occupied by a conventional 1D design rule compliant integrated circuit that has the same or similar L and Q-factor values.

Figure 3:
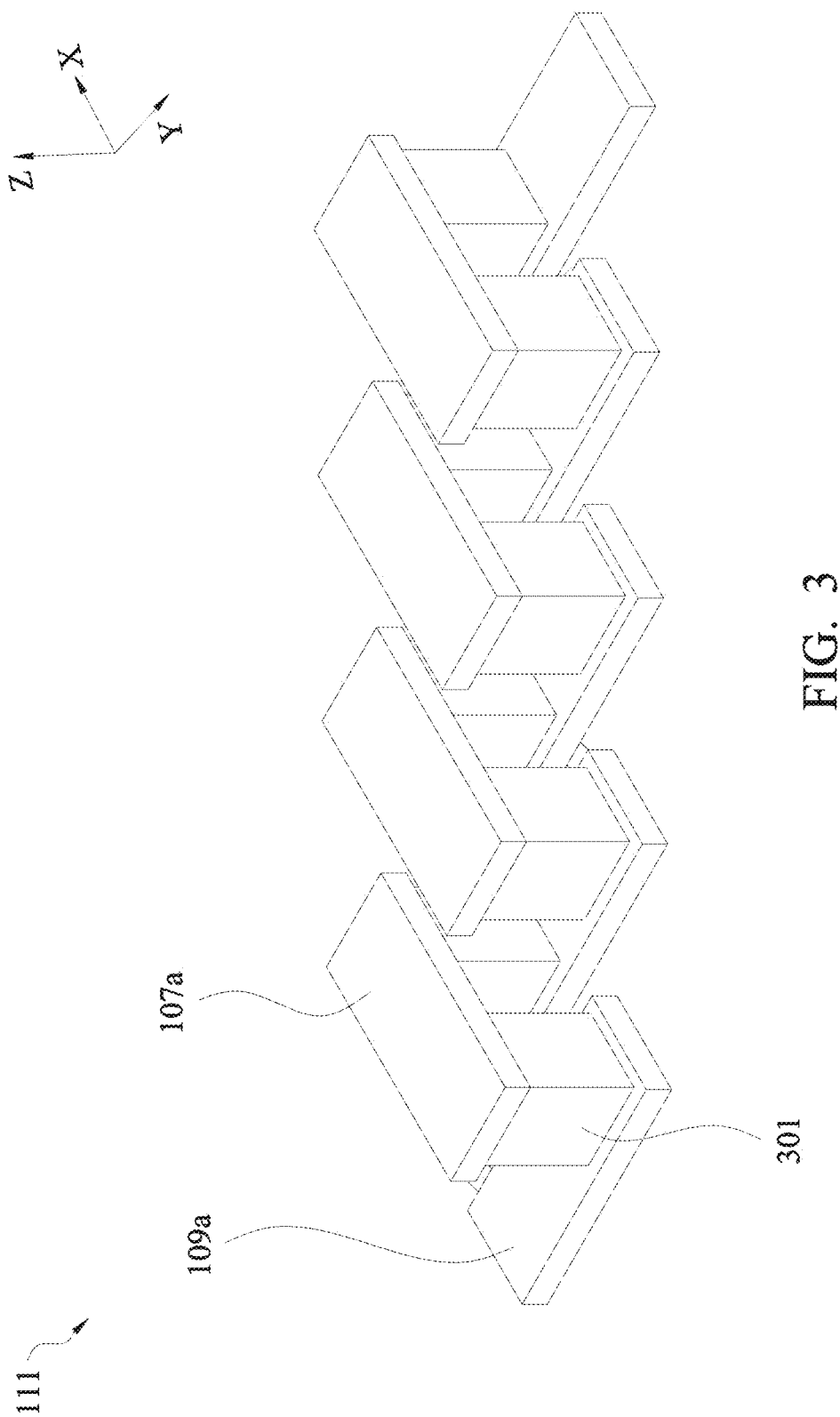
FIG. 3 is a perspective view of a staggered line, in accordance with one or more embodiments.

FIG. 3 is a perspective view diagram of a staggered line 111, in accordance with one or more embodiments. Staggered line 111 comprises first metal lines 107*a* and second metal lines 109*b*. The first metal lines 107*a* extend in the first direction X and the second metal lines 109*a* extend in the second direction Y. The first metal lines 107*a* and the second metal lines 109*a* are coupled by way of vias 301 that extend along a third direction Z. The third direction Z is perpendicular to the first direction X and the second direction Y.

In some embodiments, the vias 301 comprise a conductive material such as a metal, a metal composite, or other suitable material that is formed in one or more metallization layers, through one or more layers, or between one or more layers such as dielectric layers, insulation layers, metallization layers, or other type of layer by one or more of a physical vapor deposition process, a chemical vapor deposition process, a plating process, or other suitable process.

Figure 4:
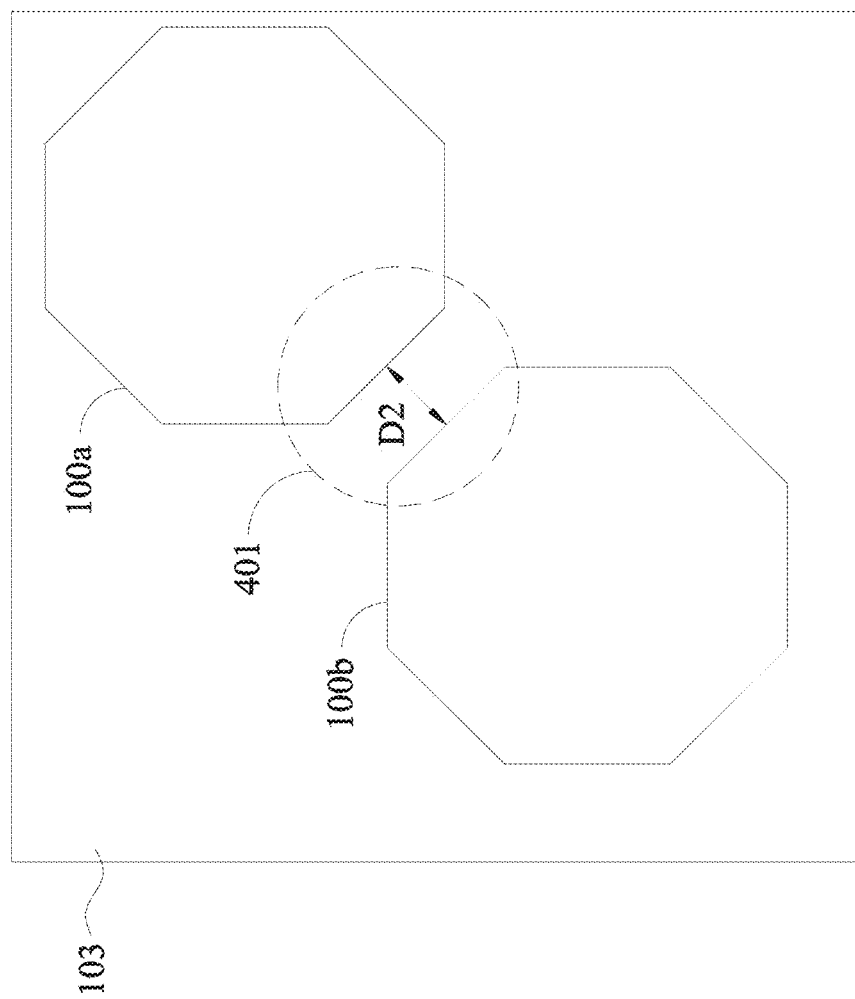
FIG. 4 is a diagram of two integrated circuits in close proximity, in accordance with one or more embodiments.

FIG. 4 is a diagram of a first integrated circuit 100*a* in close proximity to a second integrated circuit 100*b* over substrate 103, in accordance with one or more embodiments.

Because the guard rings 101 of the first integrated circuit 100*a* and the second integrated circuit 100*b* are of the same shape as the inductor 105, a space between the inductor 105 and the guard ring 101 is minimized. Additionally, the inductors 105 of the first integrated circuit 100*a* and the second integrated circuit 100*b* are capable of being placed closer to one another. In at least some embodiments, the inductors 105 of the first integrated circuit 100*a* and the second integrated circuit 100*b* are capable of being placed as close to one another as possible. In some embodiments, a guard ring 101 of the first integrated circuit 100*a* and a guard ring 101 of the second integrated circuit 100*b* are arranged on the substrate 103 such that a portion of the respective guard rings 101 are separated by a distance D2 that is from 0 micrometers to about 10 micrometers. Accordingly, the guard rings 101 of the first integrated circuit 100*a* and the second integrated circuit 100*b* reduce an area occupied by the first integrated circuit 100*a* and the second integrated circuit 100*b* on the substrate 103. In some embodiments, the first integrated circuit 100*a* and the second integrated circuit 100*b* have guard rings 101 that share a sidewall, thereby making it possible to further reduce the amount of space occupied by the first integrated circuit 100*a* and the second integrated circuit 100*b* on the substrate 103. For example, the sidewalls of the guard rings 101 of the first integrated circuit 100*a* and the second integrated circuit 100*b* that are adjacent to one another inside of imaginary circle 401 are capable of being formed as a single sidewall that is sharable between the first integrated circuit 100*a* and the second integrated circuit 100*b*.

In some embodiments, more than two integrated circuits 100 are placed near one another over substrate 103. In some embodiments, the overall shape of the integrated circuits 100 that are placed near one another over substrate 103 are the same shape. In other embodiments, the overall shape of at least one of the integrated circuits 100 that are placed near one another over the substrate 103 are different shapes such that a space occupied by the integrated circuits 100 on the substrate 103 is minimized.

Figure 5:
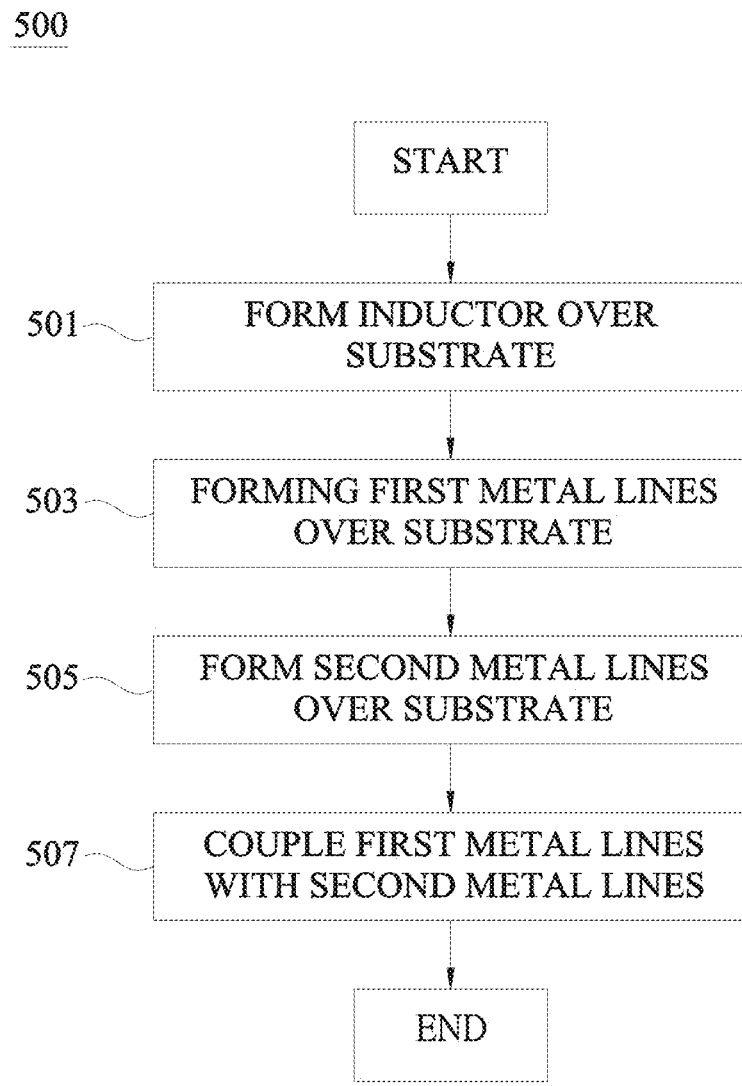
FIG. 5 is a flowchart of a method of forming an integrated circuit, in accordance with one or more embodiments.

FIG. 5 is a flowchart of a method 500 of forming an integrated circuit, in accordance with one or more embodiments. The method 500 is implemented to one or more of manufacture or design an integrated circuit such as integrated circuit 100. If method 500 is performed to design an integrated circuit, the method 500 is implemented by a processor configured to execute a set of computer-readable instructions that interface with a circuit design system to design and render a layout of an integrated circuit having the features discussed herein. In step 501, an inductor such as inductor 105 is formed over a substrate such as substrate 103. In step 503, first metal lines such as first metal lines 107*a* that extend in a first direction are formed over the substrate. In step 505, second metal lines such as second metal lines 109*a* that extend in a second direction different from the first direction are formed over the substrate. In step 507, the first metal lines are coupled with the second metal lines. In some embodiments, the first metal lines are directly coupled with the second metal lines. In other embodiments, vias such as vias 301 are formed coupling the first metal lines to the second metal lines. The first metal lines, the second metal lines, the second metal lines, and the optional vias together form a guard ring such as guard ring 101 that at least substantially surrounds the inductor.

An aspect of this description relates to an integrated circuit that includes an inductor and a guard ring. In some embodiments, the inductor includes a first set of conductors in at least a first metal layer, and being over a substrate. In some embodiments, the guard ring encloses the inductor. In some embodiments, the guard ring includes a first conductor extending in a first direction, a second conductor extending in a second direction different from the first direction, and a first set of staggered conductors coupled to a first end of the first conductor and a first end of the second conductor. In some embodiments, the first set of staggered conductors includes a second set of conductors in a second metal layer above the substrate, and extending in the first direction. In some embodiments, all metal lines in the second metal layer that are part of the guard ring extend in the first direction. In some embodiments, the first set of staggered conductors further includes a third set of conductors in a third metal layer above the substrate, the third set of conductors extending in the second direction, and the third metal layer being above the second metal layer. In some embodiments, the first set of staggered conductors further includes a first set of vias coupling the second set of conductors with the third set of conductors.

Another aspect of this description relates to an integrated circuit that includes a first metal layer above a substrate, a second metal layer above the first metal layer and the substrate, a guard ring and an inductor. In some embodiments, the guard ring includes a first set of conductive lines in the first metal layer and extending in a first direction, a second set of conductive lines in the second metal layer and extending in a second direction different from the first direction, and a set of staggered conductors. In some embodiments, the set of staggered conductors includes a third set of conductive lines in the first metal layer and extending in the first direction, a fourth set of conductive lines in the second metal layer, extending in the second direction, and being coupled to the third set of conductive lines, and a first set of vias coupled to the third set of conductive lines and the fourth set of conductive lines. In some embodiments, the first set of conductive lines or the second set of conductive lines has an opening. In some embodiments, the first set of conductive lines are coupled to the second set of conductive lines by the set of staggered conductors. In some embodiments, all conductive lines in the first metal layer that are part of the guard ring extend in the first direction. In some embodiments, the inductor is within the guard ring, and the inductor including a fifth set of conductive lines in a third metal layer above the substrate, and a first portion of the inductor extends through the opening in the first set of conductive lines or the second set of conductive lines.

A further aspect of this description relates to a guard ring that includes a staggered line comprising a plurality of first metal line segments and a plurality of second metal line segments, wherein the plurality of first metal line segments are in a first metal layer over a substrate and extend in a first direction, and all first metal line segments in the first metal layer extend in the first direction, and the plurality of second metal line segments are in a second metal layer different from the first metal layer, and being over the substrate, and the plurality of second metal line segments extend in a second direction different from the first direction, each second metal line segment in the plurality of second metal line segments is coupled to at least one first metal segment in the plurality of first metal line segments. In some embodiments, the guard ring further includes a first metal line in the first metal layer, extending in the first direction, and being coupled to a first end of the staggered line. In some embodiments, the guard ring further includes a second metal line in the second metal layer, extending in the second direction, and being coupled to a second end of the staggered line opposite from the first end of the staggered line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   an inductor including a first set of conductors in at least a first metal layer, and being over a substrate; and
   a guard ring enclosing the inductor, the guard ring comprising:
      a first conductor extending in a first direction;
      a second conductor extending in a second direction different from the first direction; and
      a first set of staggered conductors coupled to a first end of the first conductor and a first end of the second conductor, the first set of staggered conductors comprising:
         a second set of conductors in a second metal layer above the substrate, and extending in the first direction, wherein all metal lines in the second metal layer that are part of the guard ring extend in the first direction;
         a third set of conductors in a third metal layer above the substrate, the third set of conductors extending in the second direction, and the third metal layer being above the second metal layer; and
         a first set of vias coupling the second set of conductors with the third set of conductors.

2. The integrated circuit of claim 1, wherein the guard ring further comprises:
   a third conductor extending in the first direction, and being separated from the first conductor in the second direction; and
   a second set of staggered conductors coupled to a second end of the second conductor and a first end of the third conductor, the second end of the second conductor being opposite of the first end of the second conductor, the second set of staggered conductors comprising:
      a fourth set of conductors in the second metal layer, and extending in the first direction;
      a fifth set of conductors in the third metal layer, and extending in the second direction; and
      a second set of vias coupling the fourth set of conductors with the fifth set of conductors.

3. The integrated circuit of claim 2, wherein the guard ring further comprises:
   a fourth conductor extending in the second direction, and being separated from the second conductor in the first direction; and
   a third set of staggered conductors coupled to a second end of the third conductor and a first end of the fourth conductor, the second end of the third conductor being opposite of the first end of the third conductor, the third set of staggered conductors comprising:
      a sixth set of conductors in the second metal layer, and extending in the first direction;
      a seventh set of conductors in the third metal layer, and extending in the second direction; and
      a third set of vias coupling the sixth set of conductors with the seventh set of conductors.

4. The integrated circuit of claim 3, wherein the guard ring further comprises:
   a fourth set of staggered conductors coupled to a second end of the fourth conductor and a second end of the first conductor, the second end of the fourth conductor being opposite of the first end of the fourth conductor, the second end of the first conductor being opposite of the first end of the first conductor, the fourth set of staggered conductors comprising:
      an eighth set of conductors in the second metal layer, and extending in the first direction;
      a ninth set of conductors in the third metal layer, and extending in the second direction; and
      a fourth set of vias coupling the eighth set of conductors with the ninth set of conductors.

5. The integrated circuit of claim 1, wherein the inductor is a spiral inductor that is polygonal or circular.

6. The integrated circuit of claim 1, wherein the guard ring is circular or polygonal.

7. The integrated circuit of claim 1, wherein the guard ring is within a distance from the inductor.

8. The integrated circuit of claim 7, wherein the distance between the guard ring and the inductor is uniform around the inductor.

9. The integrated circuit of claim 1, wherein the guard ring has a first shape, and the inductor has a second shape different from the first shape.

10. The integrated circuit of claim 1, wherein the guard ring has a first shape, and the inductor has a same shape as the first shape.

11. An integrated circuit comprising:
    a first metal layer above a substrate;

a second metal layer above the first metal layer and the substrate;
a guard ring comprising:
a first set of conductive lines in the first metal layer and extending in a first direction;
a second set of conductive lines in the second metal layer and extending in a second direction different from the first direction, wherein the first set of conductive lines or the second set of conductive lines has an opening; and
a set of staggered conductors comprising:
a third set of conductive lines in the first metal layer and extending in the first direction;
a fourth set of conductive lines in the second metal layer, extending in the second direction, and being coupled to the third set of conductive lines, and
a first set of vias coupled to the third set of conductive lines and the fourth set of conductive lines; and
an inductor within the guard ring, and the inductor including a fifth set of conductive lines in a third metal layer above the substrate, and a first portion of the inductor extends through the opening in the first set of conductive lines or the second set of conductive lines; wherein
the first set of conductive lines are coupled to the second set of conductive lines by the set of staggered conductors, and
all conductive lines in the first metal layer that are part of the guard ring extend in the first direction.

12. The integrated circuit of claim 11, wherein the first portion of the inductor comprises:
a first contact extending in the second direction and being on the third metal layer.

13. The integrated circuit of claim 12, wherein
at least two of the conductive lines in the first set of conductive lines have an equivalent first length;
at least two of the conductive lines in the second set of conductive lines have an equivalent second length;
at least two of the conductive lines in the third set of conductive lines have an equivalent third length; and
at least two of the conductive lines in the fourth set of conductive lines have an equivalent fourth length.

14. The integrated circuit of claim 13, wherein at least one of the equivalent first length, the equivalent second length, the equivalent third length or the equivalent fourth length is different from another of the equivalent first length, the equivalent second length, the equivalent third length or the equivalent fourth length.

15. The integrated circuit of claim 13, wherein at least one of the equivalent first length, the equivalent second length, the equivalent third length or the equivalent fourth length is the same as another of the equivalent first length, the equivalent second length, the equivalent third length or the equivalent fourth length.

16. The integrated circuit of claim 11, wherein at least one conductive line of the first set of conductive lines is offset from another conductive line of the first set of conductive lines in at least the first direction or the second direction.

17. The integrated circuit of claim 11, wherein at least one conductive line of the second set of conductive lines is offset from another conductive line of the second set of conductive lines in at least the first direction or the second direction.

18. The integrated circuit of claim 11, wherein
at least one conductive line of the third set of conductive lines is offset from another conductive line of the third set of conductive lines in at least the first direction or the second direction; and
at least one conductive line of the fourth set of conductive lines is offset from another conductive line of the fourth set of conductive lines in at least the first direction or the second direction.

19. A guard ring comprising:
a staggered line comprising a plurality of first metal line segments and a plurality of second metal line segments, wherein
the plurality of first metal line segments are in a first metal layer over a substrate and extend in a first direction, and all first metal line segments in the first metal layer extend in the first direction, and
the plurality of second metal line segments are in a second metal layer different from the first metal layer, and being over the substrate, and the plurality of second metal line segments extend in a second direction different from the first direction, each second metal line segment in the plurality of second metal line segments is coupled to at least one first metal segment in the plurality of first metal line segments;
a first metal line in the first metal layer, extending in the first direction, and being coupled to a first end of the staggered line; and
a second metal line in the second metal layer, extending in the second direction, and being coupled to a second end of the staggered line opposite from the first end of the staggered line.

20. The guard ring of claim 19, wherein all second metal line segments in the second metal layer extend in the second direction.

* * * * *